US006431308B1

(12) United States Patent
Vollmer et al.

(10) Patent No.: US 6,431,308 B1
(45) **Date of Patent: *Aug. 13, 2002**

(54) HIGH FIDELITY SMALL OMNIDIRECTIONAL LOUDSPEAKER

(76) Inventors: Edward G. Vollmer, 3435 Buckner Dr., San Jose, CA (US) 95127; Teresa L. Hart, 5501 Branciforte Dr., Santa Cruz, CA (US) 95060

(*) Notice: Subject to any disclaimer, the term of this patent is extended or adjusted under 35 U.S.C. 154(b) by 0 days.

This patent is subject to a terminal disclaimer.

(21) Appl. No.: 09/661,080

(22) Filed: Sep. 13, 2000

Related U.S. Application Data

(63) Continuation-in-part of application No. 09/209,838, filed on Dec. 11, 1998, now Pat. No. 6,186,269.

(51) Int. Cl.[7] .................................................. H05K 5/00
(52) U.S. Cl. ........................................ 181/144; 181/153
(58) Field of Search ................................. 181/144, 147, 181/153, 156, 152, 154, 196, 199

(56) References Cited

U.S. PATENT DOCUMENTS 3,326,321 A * 6/1967 Valuch ....................... 181/199
3,483,945 A 12/1969 Michael
3,961,684 A 6/1976 Michael et al.
4,336,861 A 6/1982 Peter
4,420,061 A 12/1983 Levy
4,440,259 A 4/1984 Strohbeen
4,580,654 A * 4/1986 Hale .......................... 181/199
5,086,871 A 2/1992 Barbe
5,115,882 A 5/1992 Woody
5,227,591 A 7/1993 Tarkkonen
5,436,976 A 7/1995 Dougherty
5,451,726 A 9/1995 Haugum
5,847,331 A 12/1998 Vollmer et al.

* cited by examiner

*Primary Examiner*—Khanh Dang
(74) *Attorney, Agent, or Firm*—Siemens Patent Services LC

(57) ABSTRACT

A highly compact loudspeaker which produces high fidelity, omnidirectionally propagated sound from only two sound drivers. The loudspeaker has a cylindrical, sound tight housing in which are mounted a relatively high frequency sound driver and a relatively low frequency sound driver, and optionally, an intermediate frequency sound driver. The high frequency driver is fixed at the top of the cylindrical housing, and is oriented to direct sound upwardly, away from the housing. The low frequency driver is fixed to the housing at the interior thereof, thereby dividing the housing into two sound resonating chambers. The low frequency driver directs sound downwardly into the lower of the two chambers. The bottom of the lower chamber is closed by a floor which bears a crossover network conventionally connected to the two sound drivers. The sound drivers are both coaxially centered within the housing. The loudspeaker optionally has two pairs of input signal terminals and a switch for selecting between the two pairs. In a further option, the loudspeaker incorporates an amplifier for compatibility with input signal sources such as personal computers.

14 Claims, 4 Drawing Sheets

HIGH FIDELITY SMALL OMNIDIRECTIONAL LOUDSPEAKER

REFERENCE TO RELATED APPLICATION

This application is a Continuation-In-Part of Ser. No. 09/209,838, filed Dec. 12, 1998, now U.S. Pat. No. 6,186,269.

BACKGROUND OF THE INVENTION

1. Field of the Invention

The present invention sets forth a loudspeaker which propagates coherent sound waves spherically in the manner of point source. The speaker has a relatively high frequency driver and a relatively low frequency driver, both mounted in a housing that in addition to being a structural support performs the additional function of directing and delivering sound. Applications of the invention include consumer, commercial, and institutional systems for reproducing and broadcasting sound, especially musical sound.

2. Description of the Prior Art

In the field of sound reproduction, and more particularly in the field of musical reproduction, it is desirable to reproduce sound in a manner as close to the original sound as is possible. Most sound reproduction systems employ one or more drivers both as transducers for generating sound from electrical signals, and to propagate the reproduced sound. The drivers, as combined into a self-contained speaker, must reproduce sound as faithfully as possible and project that sound universally in all directions.

The prior art has proposed speaker arrangements for achieving omnidirectional sound propagation. Examples are seen in U.S. Pat. No. 3,483,945, issued to Stanley Michael on Dec. 16, 1969, U.S. Pat. No. 3,961,684, issued to Stanley H. Michael et al. on Jun. 8, 1976, U.S. Pat. No. 5,115,882, issued to D. Grier Woody on May 26, 1992, U.S. Pat. No. 5,086,871, issued to Alain Barbe on Feb. 11, 1992, U.S. Pat. No. 5,227,591, issued to Timo Tarkkonen on Jul. 13, 1993, U.S. Pat. No. 5,436,976, issued to Donald J. Dougherty on Jul. 25, 1995, and U.S. Pat. No. 5,451,726, issued to Ted L. Haugum on Sep. 19, 1995. In each case, the subject speaker lacks the precise arrangement of drivers and chambers contained within a cylindrical housing, as seen in the present invention.

None of the above inventions and patents, taken either singly or in combination, is seen to describe the instant invention as claimed.

SUMMARY OF THE INVENTION

The present invention sets forth a construction for a very small loudspeaker for producing sound waves from electrical signals which sound waves are propagated in time and phase coherent manner. The novel loudspeaker reproduces with great fidelity sound which is to be directed to a human audience inside a building or other enclosure. In particular, the novel loudspeaker is suited for consumer sound systems including audiovisual equipment, music reproduction equipment, and sound synthesizing equipment, employing sound chambers which are remarkably small for the quality and volume of the sound produced.

The novel loudspeaker has, in various embodiments, two or three speakers mounted in a common cylindrical enclosure. The enclosure serves both as a structural member and also to form resonant chambers for influencing and propagating sound. Configuration and characteristics of the enclosure and its components are selected to maximize effectiveness of the loudspeaker.

The enclosure is a sound reflective cylinder divided into resonant chambers. These chambers are separated in one embodiment by the lower frequency sound driver of two sound drivers provided in the loudspeaker. In an embodiment incorporating three sound drivers, resonant chambers are separated by the lower two sound drivers and an open intermediate chamber. The relatively low frequency sound driver directs its sound downwardly into the lowermost of the chambers. This chamber optionally opens to the outside atmosphere by a port in the lateral wall of the chamber. Optionally, the speaker is mounted on legs, and the port is formed in the floor of the chamber.

The upper chamber serves as a reverberation chamber for both the relatively high frequency sound driver, which is upwardly directed, as well as for a relatively lower frequency sound driver. High frequency sound passes through the high frequency driver, and escapes upwardly to the outside.

Sound quality and propagation characteristics arise from resonance and other phenomena resulting from relationship of sound drivers to one another and to the housing, and from acoustic properties of cylindrical configuration of the housing and its division into upper and lower chambers.

Optionally, the loudspeaker includes two pairs or sets of input signal terminals and a switch for selecting between the two pairs or sets of input signal terminals. In a further option, the loudspeaker incorporates an amplifier so that input signal sources such as personal computers are compatible with the loudspeaker.

The novel loudspeaker includes a crossover network, which is mounted on the floor of the lower chamber. Interior surfaces of the chambers of the speaker are preferably lined with acoustic padding. The exterior of the housing is covered with grille cloth which passes sound with minimal dampening and distortion.

Accordingly, it is one object of the invention to provide a loudspeaker which reproduces sound in time and phase coherent waves.

It is another object of the invention to provide a high fidelity speaker which is very small and compact for its sound output.

It is a further object of the invention that the novel loudspeaker be capable of ready connection to different input signal sources.

Still another object of the invention is to provide a high fidelity compact speaker which is compatible with personal computers as sources of sound input signals.

An additional object of the invention is to provide high fidelity sound employing only two sound drivers.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Various other objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENTS

Figure 1:
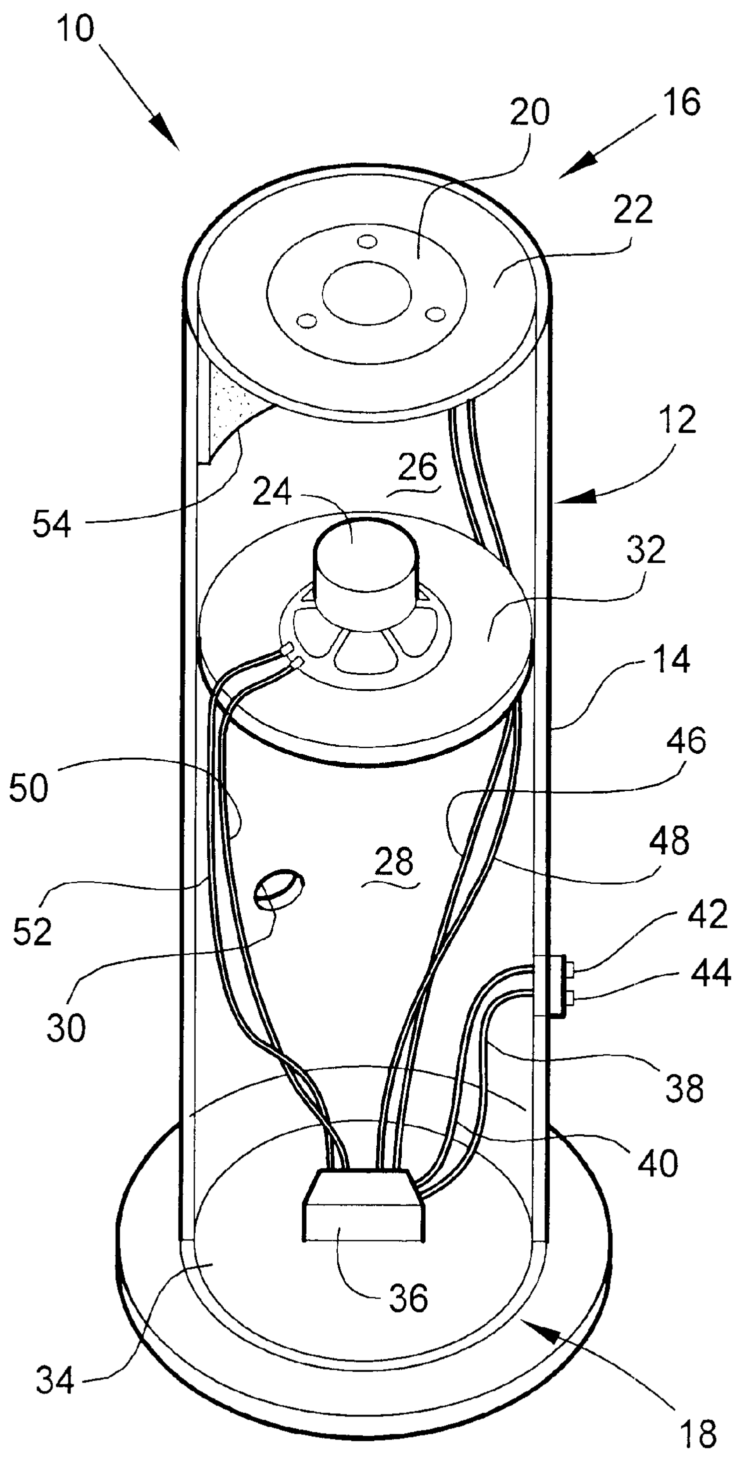
FIG. 1 is a front perspective view of one embodiment of the invention, partially broken away to reveal internal detail.

Turning now to FIG. 1 of the drawings, novel loudspeaker 10, which propagates coherent sound waves spherically in the manner of point source is seen to comprise a cylindrical housing 12 having a lateral wall 14, an upper end 16, and a lower end 18. Housing 12 is fabricated from a sound reflective material such as polyvinyl chloride or acrilonitrilebutadiene styrene, which materials provide magnetic shielding by virtue of their chemical constituents. A relatively high frequency sound driver 20 is mounted within housing 12 at upper end 16. An annular plate 22 provides a supporting surface. Plate 22 is annular in that it is generally disc shaped, having a central opening for passing sound upwardly from sound driver 20. Plate 22 projects radially inwardly from lateral wall 14. High frequency sound driver 20 is oriented to propagate sound upwardly, away from housing 12. High frequency sound driver 20 is preferably a one inch, silk soft dome driver of power in a range of thirty-five to fifty watts, with sound volume capability up to ninety-four dB and frequency capability of two thousand to twenty thousand hertz.

Figure 2:
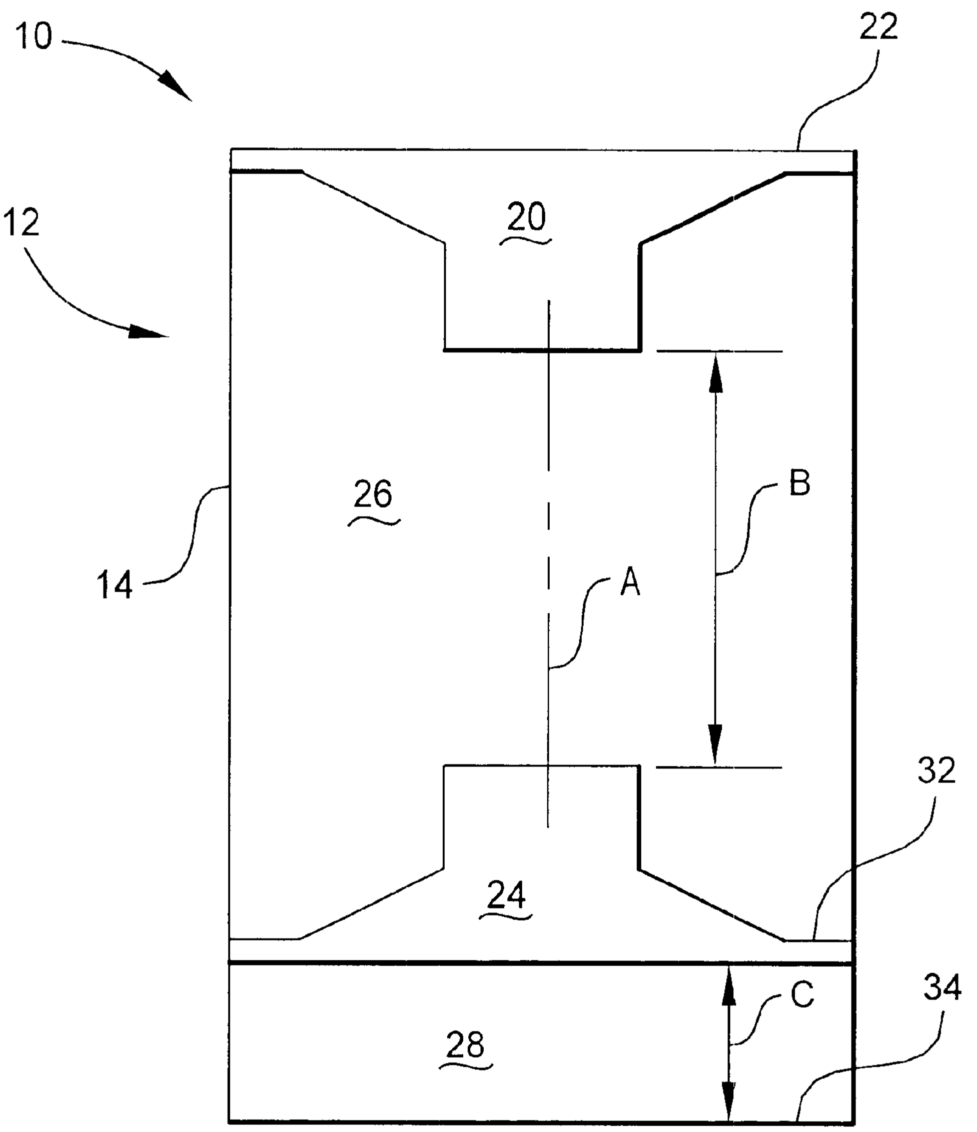
FIG. 2 is an exaggerated side elevational diagrammatic view of the embodiment of FIG. 1.

A relatively low frequency sound driver 24 is mounted within housing 12 such that low frequency driver 24 divides housing into an upper chamber 26 located between and closed by high frequency driver 20 and low frequency driver 24, and a lower chamber 28 located below low frequency driver 24. Sound driver 24 is oriented to project sound downwardly in the depiction of FIG. 1, into chamber 28. Low frequency sound driver 24 is preferably a pole piece vented, midbass carbon fiber cone driver, with sound volume capability up to ninety-four dB and frequency capability of fifty hertz to twelve thousand hertz. Characteristics of drivers 20, 24 are generally conventional, and drivers of these specifications are readily commercially available. High and low frequency drivers 20, 24 are coaxially centered within housing 12 along longitudinal axis A (see FIG. 2).

Chamber 28 has a port 30 for allowing sound to escape. Low frequency sound driver 24 is oriented to propagate sound downwardly into chamber 28 and out through port 30. Chamber 26 is sealed at upper end 16 by high frequency driver 20, and is sealed at the bottom by low frequency driver 24. Low frequency driver 24 is provided with a support plate 32. Plates 22, 32 may, for example, adapt overall diameter of each driver 20 or 24 to bridge the distance, if such distance exists, between the outer diameter of the driver 20 or 24 and the interior surface of housing 12. Each plate 22 or 32 has a central opening (concealed from view in each case by its associated driver 20 or 24) for passing sound through the air.

Plates 22, 32 also provide suitable surfaces for receiving silicone caulk (not shown) which is employed to seal drivers 20, 24. Low frequency driver 22 is sealed by a material such as silicone caulk or an equivalent where it contacts the interior surface of housing 12. Chamber 28 is closed at its upper end by low frequency sound driver 24 and at its lower end, which coincides with lower end 18 of housing 12, by a floor 34. Sealing at the upper end of chamber 26 is essentially sound tight, in that there exists no air passage for conducting sonic vibration. Sealing of the lower end of chamber 26 is preferably accomplished in a similar manner, so that sound, where it passes through the air, exits chamber 28 through port 30.

A crossover network 36 is mounted on floor 30, and is operably connected to high and low frequency drivers 20, 24 to control drivers 20, 24 conventionally by sending appropriate bandpass frequency signals to drivers 20, 24. Connections of crossover network 36 to drivers 20, 24 is conventional, and incorporates conductors 38, 40 which extend to input signal terminals 42, 44. Conductors 46, 48 connect crossover network 36 to sound driver 20, and conductors 50, 52 connect crossover network 36 to sound driver 24.

Acoustic padding 54 lines chambers 26, 28 at the interior surface of housing 12. Padding 54 is preferably one quarter inch thick, if formed from a material having acoustic damping characteristics of a layer of cotton batting one inch thick. Padding 54 is broken along the circumference of sound driver 22 so that the latter may be bonded to housing 12 by silicone caulk.

Novel loudspeaker 10 achieves remarkable sound quality despite relatively small dimensions. Sound drivers 20, 24 are spaced apart such that the distance B from sound driver 20 to sound driver 24 is in the range of two and one half inches to two and three quarter inches. The height C of chamber 28, taken from plate 32 to plate 34, is in a range of three and one quarter inches to three and three quarter inches, preferably being three and one half inches. The heights of chambers 26, 28 are related to sound frequencies, and must not be varied even if other dimensions of speaker 10 are varied.

It is anticipated that the overall diameter of housing 12 can vary from four and one half inches to twelve inches, to accommodate standard commercially available sound drivers having overall nominal diameters of four inches, six inches, eight inches, and twelve inches. In the preferred embodiment, speaker 10 utilizes sound drivers having overall nominal diameters of four inches. In the latter case, the preferred embodiment, housing 12 has length in a range of six to seven inches, preferably six and one half inches, and has a diameter in a range of four to five inches, preferably four and one half inches.

Figure 3:
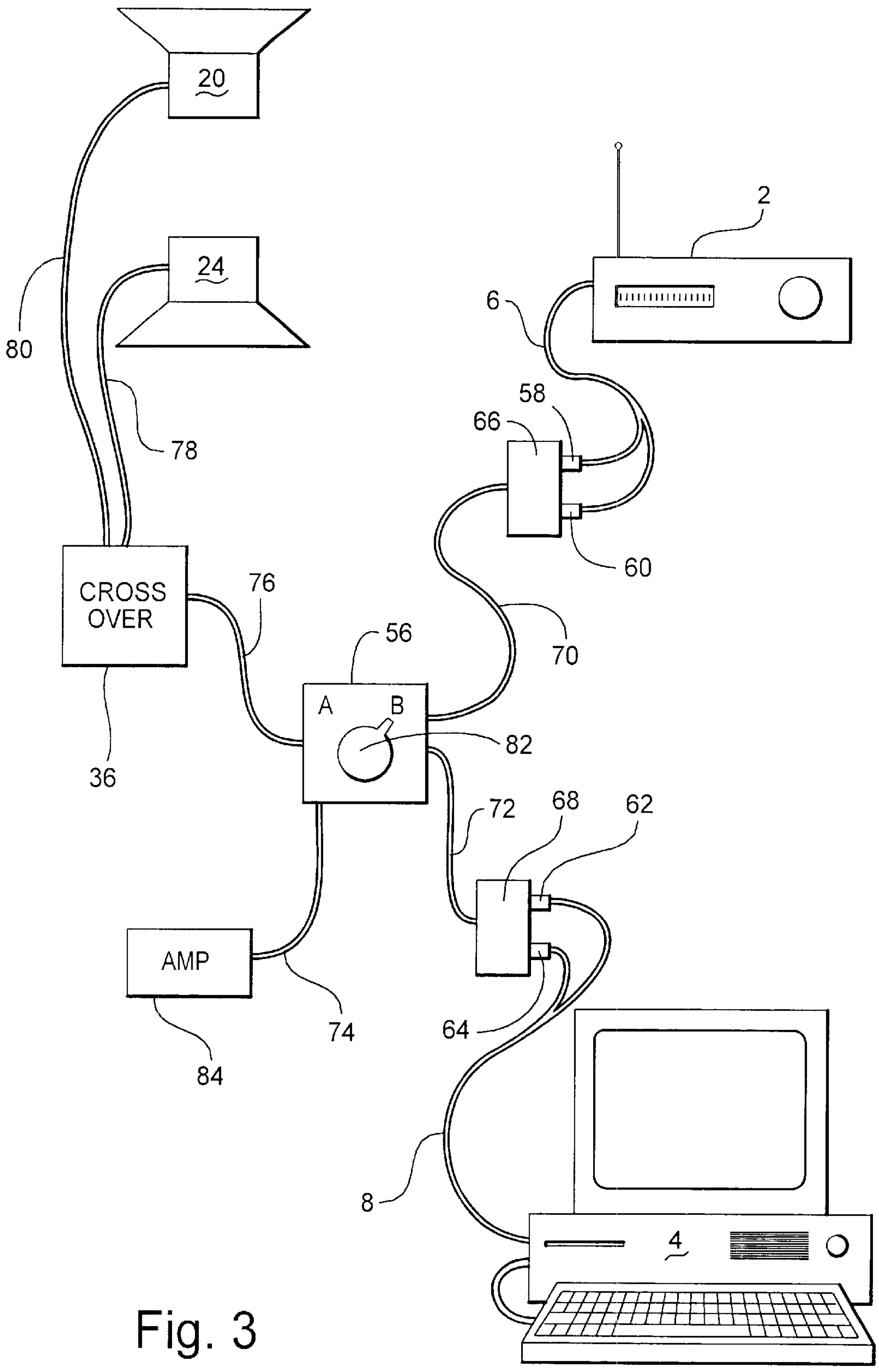
FIG. 3 is an environmental, diagrammatic view of electrical components of an alternative embodiment of the invention.

Turning now to FIG. 3, the electrical components of FIG. 1 are modified to enable a user to select the source of speaker input signals by a two position switch 56. Illustratively, speaker input signals are selectively derived from a radio receiver 2 and a personal computer 4. Sound drivers 20, 24 and crossover network 36 are similar to those of the embodiment of FIG. 1 and are connected similarly. However, switch 56 is interposed between input terminals 58, 60, 62, 64 and crossover network 36. Preferably, terminals 58, 60 are formed as part of a terminal assembly 66, and terminals 62, 64 are formed as part of a functionally similar terminal assembly 68, wherein the terminals of each respective terminal assembly are spaced apart to accommodate standard two conductor terminals (not separately shown). Communication cables 6, 8 serving radio receiver 2 and computer 4 typically terminate in two conductor terminals (not shown), such as coaxial conductor terminals. It will be understood that the various cables 70, 72, 74, 76, 78, 80 depicted in FIG. 3 have sufficient individual electrically isolated conductors to operate sound drivers 20, 24.

Switch 56 has an operator 82 movable to two positions (identified as “A” and “B” in FIG. 3), each position being operable to connect crossover network 36 selectively to cable 70 or to cable 72. In each position, that cable 70 or 72 not selected for connection to crossover network 36 is disconnected from crossover network 36, so that only one source of signals is connected to sound drivers 20, 24 at any one time.

An amplifier such as PMOP amplifier 84 is operably connected by switch 56 to one cable, such as cable 72. Amplifier 84 amplifies power signals derived from a connected signal source which is inadequately powered to produce audible sound from sound drivers 20, 24 directly. Amplifier 84 provides necessary amplification assuring that sound drivers 20, 24 produce audible sounds responsive to the input signals.

Figure 4:
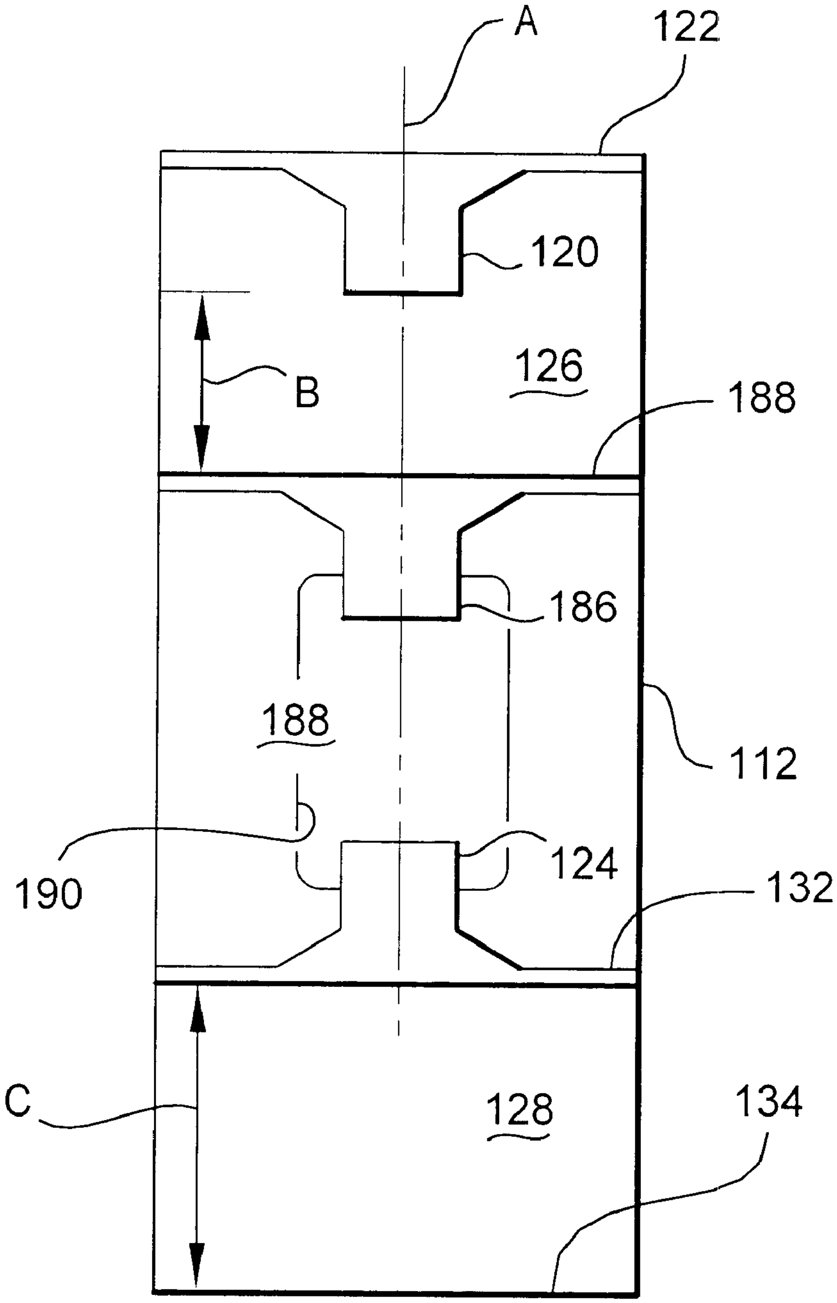
FIG. 4 is a side elevational, diagrammatic view of a further alternative embodiment of the invention, partially broken away to reveal internal detail.

FIG. 4 shows a variation on the prior embodiments, wherein speaker 110 includes a relatively high frequency sound driver 120, a relatively low frequency sound driver 124, and an intermediate frequency sound driver 186. Sound drivers 120, 124, 186 are mounted on respective annular plates 122, 132, 188 in a manner similar to that of the embodiment of FIG. 1. An upper chamber 126 is formed between sound drivers 120 and 186, and is dimensioned and configured such that spacing between sound drivers 120 and 186 is between two and one half inches and two and three quarter inches. A lower chamber 128 formed between sound driver 124 and floor 134 of housing 112 has a height C, taken between plate 132 and floor 134, of three and one half inches. A chamber 188 is formed between sound drivers 124 and 186. Chamber 188 opens to the outside to enable sound to escape by one or more openings such as window 190. Sound drivers 120, 124, 186 are operably connected to a crossover network (not shown) and to input signals in a manner similar to that of the embodiment of FIG. 1. A two position switch (not shown) functionally similar to switch 56 of FIG. 3 and an amplifier (not shown) functionally similar to amplifier 84 of FIG. 3 are optionally provided for the embodiment of FIG. 4.

The embodiments of FIGS. 1 and 4 are similar in that respective uppermost chambers 26 and 126 have similar spacing between opposed respective sound drivers 20, 24 (FIG. 1) and 120, 186 (FIG. 4), the spacing being in the range of two and one half to two and three quarter inches. Respective lowermost chambers 28 (FIG. 1) and 128 (FIG. 4) also have similar height of three and one half inches. Chambers 26, 126, 28, 128 influence sound quality due to resonance. Hence, spacing and height are important parameters for sound reproduction.

It will be appreciated that in the embodiment of FIG. 1, the uppermost and lowermost chambers are separated by a common component, namely, sound driver 24 and its associated mounting plate 32. By contrast, in the embodiment of FIG. 4, the uppermost and lowermost chambers are separated by two sound drivers 124, 186 and intervening chamber 188. Nonetheless, the two embodiments share the characteristic that there are in each embodiment an uppermost chamber and a lowermost chamber. Location and orientation (where orientation refers to direction of projection of sound) are also similar for the highest and lowest frequency sound drivers between the two embodiments.

The relatively highest frequency sound driver in each embodiment has an adjacent sound driver. In the embodiment of FIG. 1, the adjacent sound driver is the same as downwardly oriented relatively low frequency sound driver 24. In the embodiment of FIG. 4, the adjacent sound driver 186 is not the same as downwardly oriented relatively low frequency sound driver 124. Despite these differences, it will be noted that both embodiments have a sound driver adjacent to the relatively high frequency sound driver and a downwardly oriented relatively low frequency sound driver.

The invention is susceptible to variations and modifications which can be introduced thereto without departing from the inventive concept. For example, hard wiring of speakers shown herein could be supplanted by wireless connection, such as by radio frequency signals. Any suitable frequency allowed by the Federal Communication Commission would be acceptable, although it is preferred to employ a frequency such as 900 MHz.

In another variation, port 30 shown in FIG. 1 could be relocated to floor 34. This variation would preferably further include legs (not shown) spacing loudspeaker 10 above a floor or other supporting horizontal surface.

Where necessary to provide electrical power, such as for amplification, the novel loudspeaker in any of its embodiments may optionally include power conductors connected to any electrical component requiring power beyond that supplied by input signals. Supplementary power circuitry may optionally include an AC-to-DC converter, if desired.

It is to be understood that the present invention is not limited to the embodiments described above, but encompasses any and all embodiments within the scope of the following claims.

We claim:

1. A loudspeaker capable of propagating coherent sound waves spherically in the manner of point source, comprising:

a cylindrical housing having a lateral wall, a first end, and a second end;

a relatively high frequency sound driver mounted in said first end of said housing, wherein said relatively high frequency driver is oriented to propagate sound away from said housing; and at least one other sound driver mounted within said housing below said relatively high frequency sound driver mounted within said housing such that said other sound driver divides said housing into an uppermost chamber located between said relatively high frequency driver and said other sound driver, and a lowermost chamber located below said other sound driver, wherein at least one other sound driver is adjacent to said relatively high frequency sound driver and is spaced apart from said relatively high frequency sound driver by a distance in the range of two and one half to two and three quarters of an inch, and said at least one other sound driver includes a relatively low frequency sound driver oriented to propagate sound downwardly into said lowermost chamber.

2. The loudspeaker according to claim 1, wherein said uppermost chamber is closed at said first end by said relatively high frequency driver and said uppermost chamber is closed at the bottom by said relatively low frequency driver.

3. The loudspeaker according to claim 1, wherein said relatively high frequency driver and said relatively low frequency drivers are coaxially centered within said housing.

4. The loudspeaker according to claim 1, further including a crossover network disposed to control said relatively high frequency driver and said relatively low frequency driver.

5. The loudspeaker according to claim 4, further comprising a first pair of input terminals and a second pair of input terminals, conductors operably connecting said first pair of input terminals and said second pair of input terminals to said crossover network, and a two position switch disposed selectively to connect one of said first pair of input terminals and said second pair of input terminals to said crossover network and to disconnect the other one of said first pair of input terminals and said second pair of input terminals from said crossover network.

6. The loudspeaker according to claim 5, further comprising an amplifier operably connected to one of said first pair of input terminals and said second pair of input terminals, disposed to amplify power of signals conducted thereby such that said first sound driver and said second sound driver produce audible sounds responsive to said signals.

7. The loudspeaker according to claim 1, wherein said housing has length in a range of six to seven inches, and has a diameter in a range of four to five inches.

8. The loudspeaker according to claim 1, further comprising a floor disposed to close said lowermost chamber of said housing.

9. The loudspeaker according to claim 1, further comprising a first annular mounting plate fixed to said housing and to said relatively high frequency sound driver, and a second annular mounting plate fixed to said housing and to said relatively low frequency sound driver.

10. The loudspeaker according to claim 1, wherein said at least one other sound driver mounted within said housing below said relatively high frequency sound driver includes a relatively intermediate range sound driver located adjacent to and below said relatively high frequency sound driver and said relatively low frequency sound driver located adjacent to and below said relatively intermediate frequency sound driver.

11. A loudspeaker capable of propagating coherent sound waves spherically in the manner of point source, comprising:

a cylindrical housing having a lateral wall, a first end, and a second end;

a relatively high frequency sound driver mounted in said first end of said housing, wherein said relatively high frequency driver is oriented to propagate sound away from said housing;

a relatively low frequency sound driver mounted within said housing such that said relatively low frequency driver divides said housing into an uppermost chamber located between said relatively high frequency driver and said relatively low frequency driver and a lowermost chamber located below said relatively low frequency driver, wherein said lowermost chamber has a floor closing said lowermost chamber at said second end of said housing and a port for allowing sound to escape, wherein said relatively low frequency sound driver is oriented to propagate sound downwardly into said lowermost chamber and out through said port, wherein said uppermost chamber is closed at said first end by said relatively high frequency driver and said uppermost chamber is closed at the bottom by said relatively low frequency driver, and wherein said relatively high frequency driver and said relatively low frequency drivers are coaxially centered within said housing;

a first mounting ring fixed to said housing and to said relatively high frequency sound driver, and a second mounting ring fixed to said housing and to said relatively low frequency sound driver; and a crossover network disposed to control said relatively high frequency driver and said relatively low frequency driver.

12. The loudspeaker according to claim 11, wherein said housing has length in a range of six to seven inches and a diameter in a range of four to five inches, said uppermost chamber has a height in a range of two and one half inches to two and three quarter inches, and said lowermost chamber has a height in a range of three to four inches.

13. A loudspeaker capable of propagating coherent sound waves spherically in the manner of point source, comprising:

a cylindrical housing having a lateral wall, a first end, and a second end;

a relatively high frequency sound driver mounted in said first end of said housing, wherein said relatively high frequency driver is oriented to propagate sound away from said housing;

a relatively intermediate frequency sound driver mounted in said housing below and adjacent to said relatively high frequency sound driver, wherein said relatively high frequency sound driver and said relatively intermediate frequency sound driver are spaced apart by a distance in a range of two and one half inches to two and three quarter inches, said relatively high frequency sound driver and said relatively intermediate frequency sound driver form an uppermost resonant chamber therein, and said relatively intermediate frequency sound driver is oriented to propagate sound towards said relatively high frequency sound driver;

a relatively low frequency sound driver mounted within said housing below and adjacent said relatively intermediate frequency sound driver, wherein said relatively low frequency sound driver and said relatively intermediate frequency sound driver are spaced apart by a distance in a range from three and one quarter inches to three and three quarter inches, said relatively low frequency sound driver is oriented to propagate sound towards said second end of said housing, away from said relatively intermediate frequency sound driver, and said relatively high frequency sound driver, said relatively intermediate frequency sound driver, and said relatively low frequency sound driver are coaxially centered within said housing;

a floor closing said second end of said housing, wherein said relatively low frequency sound driver and said floor form a lowermost resonant chamber within said housing;

a crossover network contained within said housing, disposed to control said relatively high frequency driver and said relatively low frequency driver;

a first pair of input terminals and a second pair of input terminals, conductors operably connecting said first pair of input terminals and said second pair of input terminals to said crossover network, and a two position switch disposed selectively to connect one of said first pair of input terminals and said second pair of input terminals to said crossover network and to disconnect the other one of said first pair of input terminals and said second pair of input terminals from said crossover network; and an amplifier operably connected to one of said first pair of input terminals and said second pair of input terminals, disposed to amplify power of signals conducted thereby such that said first sound driver and said second sound driver produce audible sounds responsive to said signals.

14. The loudspeaker according to claim 13, further comprising a first annular mounting plate fixed to said housing and to said relatively high frequency sound driver, a second annular mounting plate fixed to said housing and to said relatively intermediate frequency sound driver, and a third annular mounting plate fixed to said housing and to said relatively low frequency sound driver.

* * * * *